United States Patent
Chandraiah et al.

(10) Patent No.: US 11,144,687 B1
(45) Date of Patent: Oct. 12, 2021

(54) METHOD AND SYSTEM PROVIDING VISUALIZATION OF SUB-CIRCUIT ITERATIONS BASED ON HANDSHAKE SIGNALS

(71) Applicant: Xilinx, Inc., San Jose, CA (US)

(72) Inventors: Pramod Chandraiah, Pleasanton, CA (US); Roger Ng, Campbell, CA (US); Alain Darte, Lyons (FR); Radharamanan Radhakrishnan, San Jose, CA (US); Peter Frey, San Jose, CA (US); Kumar Deepak, San Jose, CA (US)

(73) Assignee: XILINX, INC., San Jose, CA (US)

( * ) Notice: Subject to any disclaimer, the term of this patent is extended or adjusted under 35 U.S.C. 154(b) by 398 days.

(21) Appl. No.: 16/370,260

(22) Filed: Mar. 29, 2019

(51) Int. Cl.
*G06F 30/30* (2020.01)
(52) U.S. Cl.
CPC .................. *G06F 30/30* (2020.01)
(58) Field of Classification Search
USPC ........................................ 702/118
See application file for complete search history.

(56) References Cited

U.S. PATENT DOCUMENTS

| | | | | |
|---|---|---|---|---|
| 2004/0163072 A1* | 8/2004 | Levy | ............ | G06F 30/30 717/106 |
| 2009/0164704 A1* | 6/2009 | Kanade | ............ | G06F 11/1068 711/103 |
| 2010/0332909 A1* | 12/2010 | Larson | ............ | G06F 11/3495 714/40 |
| 2011/0225559 A1* | 9/2011 | Nishide | ............ | G06F 11/2257 716/106 |
| 2011/0307688 A1* | 12/2011 | Nurvitadhi | ............ | G06F 30/30 712/219 |
| 2017/0126425 A1* | 5/2017 | Giaconi | ............ | G06F 30/34 |

* cited by examiner

*Primary Examiner* — Mohammed Alam
(74) *Attorney, Agent, or Firm* — Crawford Maunu PLLC

(57) ABSTRACT

Disclosed approaches monitor states of a plurality of sets of a plurality of handshake signals. Each set of handshake signals is associated with a respective one sub-circuit of a plurality of sub-circuits. For each sub-circuit, a beginning of an iteration by the sub-circuit is detected based on states of the plurality of handshake signals of the set associated with the sub-circuit. A graphics object is generated in response to detecting the beginning of the iteration. The graphics object is displayed on a display device and overlaid on a timeline associated with the sub-circuit. The graphics object has a bound that corresponds to the beginning of the iteration. The end of the iteration is detected based on the states of the associated set of handshake signals, and the graphics object is bounded on the timeline to indicate the end of the iteration.

20 Claims, 9 Drawing Sheets

|  | to state | | | | |
|---|---|---|---|---|---|
| from state | start/ready | 0/0 | 0/1 | 1/0 | 1/1 |
|  | 0/0 | stable | early ACK error | begin handshake + | begin and end handshake + |
|  | 0/1 | noise error | stable error | noise&begin handshake + error | begin and end handshake + error |
|  | 1/0 | error | error | handshake in progress | end handshake |
|  | 1/1 | wait for start | early ACK error | begin handshake + | begin and end handshake + |

+ ⟹ increment active iteration count

FIG. 5

| from state \ to state | 0/0 | 0/1 | 1/0 | 1/1 |
|---|---|---|---|---|
| done/continue | | | | |
| 0/0 | stable | early ACK | begin handshake — | begin and end handshake — |
| 0/1 | noise | stable | noise&begin handshake — | begin and end handshake — |
| 1/0 | error | error | handshake in progress | end handshake — |
| 1/1 | wait for done | early ACK | begin handshake — | begin and end handshake — |

— ⇒ decrement active iteration count

FIG. 6

METHOD AND SYSTEM PROVIDING VISUALIZATION OF SUB-CIRCUIT ITERATIONS BASED ON HANDSHAKE SIGNALS

TECHNICAL FIELD

The disclosure generally relates to correlating multiple handshake signals between sub-circuits that are executed in parallel and providing a visual indication of concurrent iteration states of the sub-circuits.

BACKGROUND

High-level synthesis (HLS) involves the translation of high-level language (HLL) program code into a hardware description language (HDL) specification. HLLs allow designers to specify functions in a more abstract manner than do HDLs. Also, HLS can be used to translate selected HLL functions into hardware in order to accelerate those functions and improve performance. In translating HLL functions into a hardware specification and then into hardware, the resulting hardware often employs task/dataflow pipelines that exploit parallelism and increase throughput. These task/dataflow pipelines can include sub-circuits that exchange handshake signals to coordinate operations in the stages of the pipeline.

A design process will often involve an evaluation phase during which the design is analyzed and/or debugged. The design can be analyzed to identify bottlenecks and modify the design in order to improve performance. If a simulation or implemented circuit indicates an error in operation, the design can be debugged to uncover the source of the error.

Analysis and debugging of the resulting circuit design involve analysis of the states of register transfer language (RTL) signals of the circuit design. Determining the parallel activity of the sub-circuits from the states of the waveforms of the multiple handshake signals of multiple sub-circuits can require expert knowledge beyond the skills of a software developer and can be tedious, even for an experienced circuit designer.

SUMMARY

According to a disclosed method, an analyzer tool executing on a computer system monitors states of a plurality of sets of a plurality of handshake signals by an analyzer tool executing on a computer system. Each set of handshake signals is associated with a respective one sub-circuit of a plurality of sub-circuits. The analyzer tool, for each sub-circuit, detects a beginning of an iteration by the sub-circuit based on states of the plurality of handshake signals of the set associated with the sub-circuit, and generates, in response to detecting the states indicating the beginning of the iteration, a respective graphics object representative of the iteration. The analyzer tool displays the respective graphics object on a display device. The graphics object is overlaid on a timeline associated with the sub-circuit and has a bound that corresponds to the beginning of the iteration. The analyzer tool detects the end of the iteration based on the states of the associated set of handshake signals and bounds the graphics object on the timeline to indicate the end of the iteration.

According to a disclosed system, one or more computer processors are configured to execute program code, and a memory arrangement is coupled to the one or more computer processors. The memory arrangement is configured with instructions that when executed by the one or more computer processors cause the one or more computer processors to monitor states of a plurality of sets of a plurality of handshake signals. Each set of handshake signals is associated with a respective one sub-circuit of a plurality of sub-circuits. The computer processor(s), for each sub-circuit, can detect a beginning of an iteration by the sub-circuit based on states of the plurality of handshake signals of the set associated with the sub-circuit, and generate, in response to detecting the states indicating the beginning of the iteration, a respective graphics object representative of the iteration. The computer processor(s) display the respective graphics object on a display device. The graphics object is overlaid on a timeline associated with the sub-circuit and has a bound that corresponds to the beginning of the iteration. The computer processor(s) detects the end of the iteration based on the states of the associated set of handshake signals and bounds the graphics object on the timeline to indicate the end of the iteration.

Other features will be recognized from consideration of the Detailed Description and Claims, which follow.

BRIEF DESCRIPTION OF THE DRAWINGS

Various aspects and features of the methods and system will become apparent upon review of the following detailed description and upon reference to the drawings in which:

FIG. 5 shows a state diagram that can be used to identify the beginning of an iteration, and a violation of a handshake protocol based on signal states of the start and ready handshake signals of a sub-circuit;

FIG. 6 shows a state diagram that can be used to identify the end of an iteration, a stalled state of a sub-circuit, and a violation of a handshake protocol based on signal states of the done and continue handshake signals of a sub-circuit;

DETAILED DESCRIPTION

Figure 1:
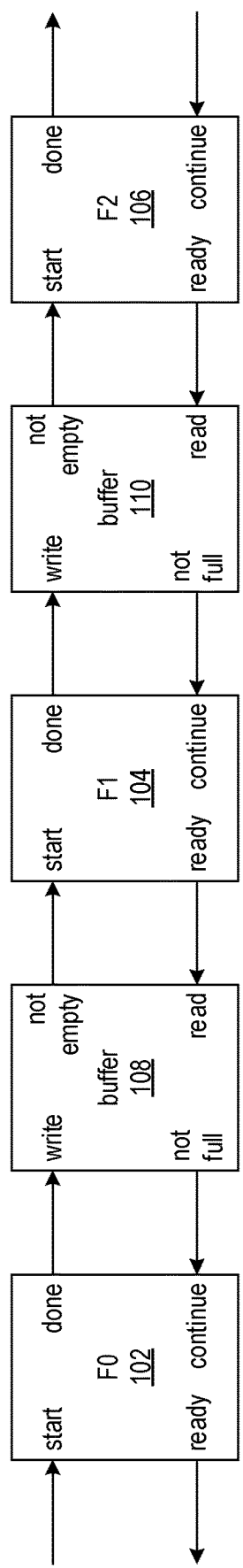
FIG. 1 shows exemplary circuitry generated from a high-level language (HLL) function.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed approaches provide improved methods and systems for debugging and analyzing handshake signaling and circuit behavior in pipelined circuitry. A protocol analyzer tool monitors sets of handshake signals used by the sub-circuits of the pipelined circuitry. The handshake signals control the flow of data between the sub-circuits. A high-level transaction view is generated by the analyzer tool to illustrate the parallel activity of the sub-circuits. The high-level transaction view charts the duration of the iterations of the sub-circuits as indicated by handshake signals in the data input sides and the data output sides of the sub-circuits. The analyzer tool further detects stalls by the sub-circuits in participating in the handshake protocol and illustrates the duration of a stall separate from the signals whose states indicate a stall. By showing a high level transaction view of the parallelism of iterations and stalls between the pipelined sub-circuits, the disclosed approaches provide an effective means to debug, analyze, and optimize HLS-generated circuit designs.

Optimization of task/dataflow pipelining can be implemented as a run-time/dynamic optimization based on the handshaking signals, as performance cannot be estimated for a dynamic implementation architecture, unlike a static pipeline in which latency and throughput of the pipeline can be reasonably estimated.

In one approach, an analyzer tool inputs and monitors the states of sets of multiple handshake signals. Each set of handshake signals is associated with one of the sub-circuits and includes handshake signals on the data input side of the sub-circuit and handshake signals on the data output side of the sub-circuit. The analyzer tool detects for each sub-circuit, the beginning of an iteration based on the states of the set of handshake signals associated with the sub-circuit. An "iteration" refers to the duration from the time at which the handshake signals indicate that the sub-circuit begins processing an input data set to the time that the sub-circuit signals that processing of that data set is complete. Once the beginning of an iteration is detected, the analyzer tool generates a graphics object that represents the iteration. The graphics object is overlaid on a timeline associated with the sub-circuit and has a bound on the timeline to indicate the time at which the iteration began. In monitoring the handshake signals, the analyzer tool also detects the end of an iteration based on the states of a set of handshake signals. When the end of an iteration is detected, the analyzer tool bounds the graphics object that signifies the iteration on the timeline at the time at which the iteration ended.

Figure 2:
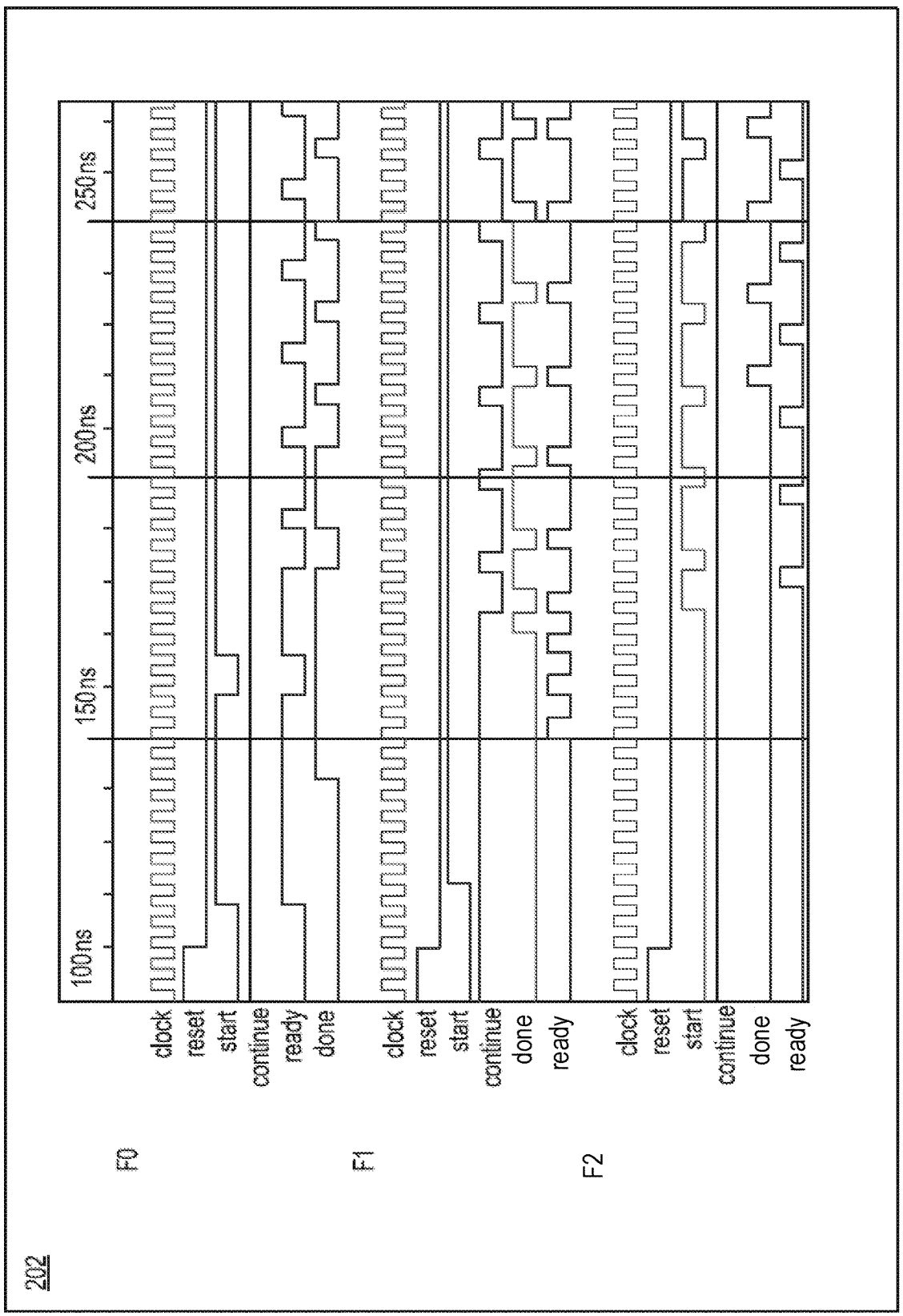
FIG. 2 shows an exemplary display of the handshake signals associated with the sub-circuits generated from exemplary HLL program code.
Figure 3:
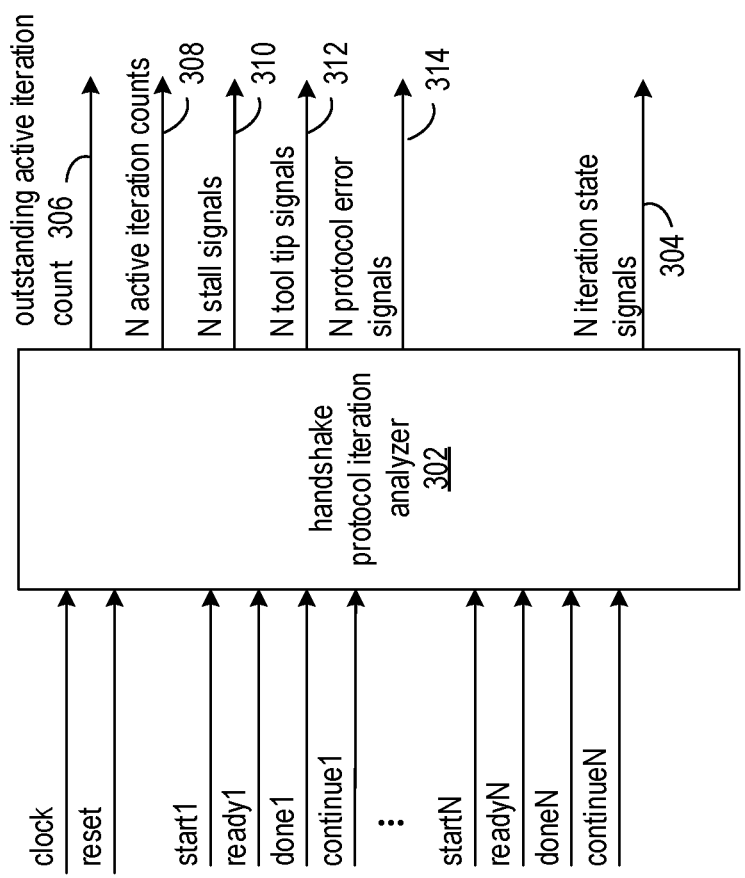
FIG. 3 shows a handshake protocol analyzer tool that translates handshake signal states into graphics objects that illustrate active iterations of sub-circuits of a circuit design.
Figure 4:
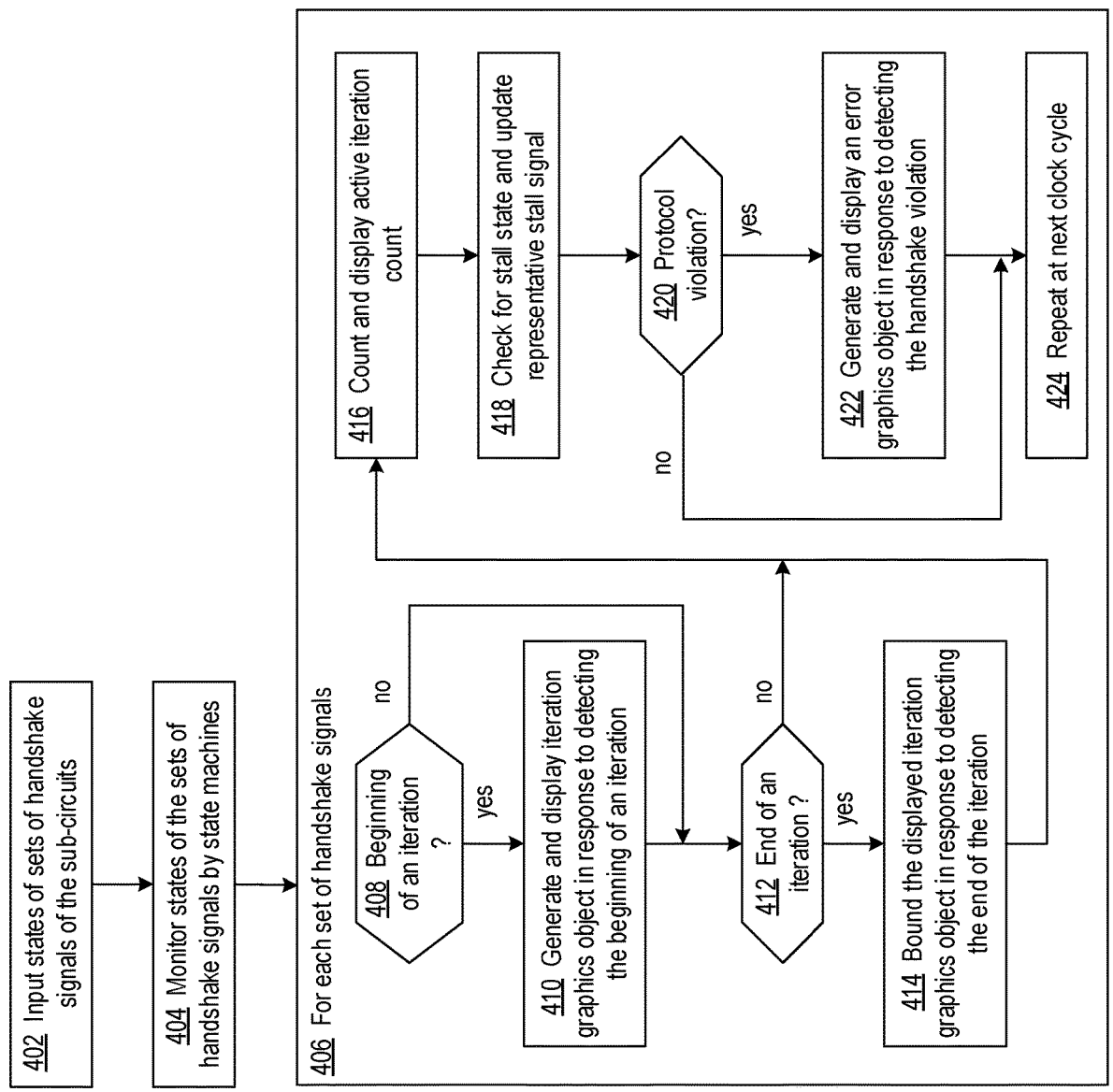
FIG. 4 shows a flowchart of a process for detecting iteration states of pipelined sub-circuits and displaying useful information regarding the iteration states based on handshake signals between the sub-circuits.
Figure 7:
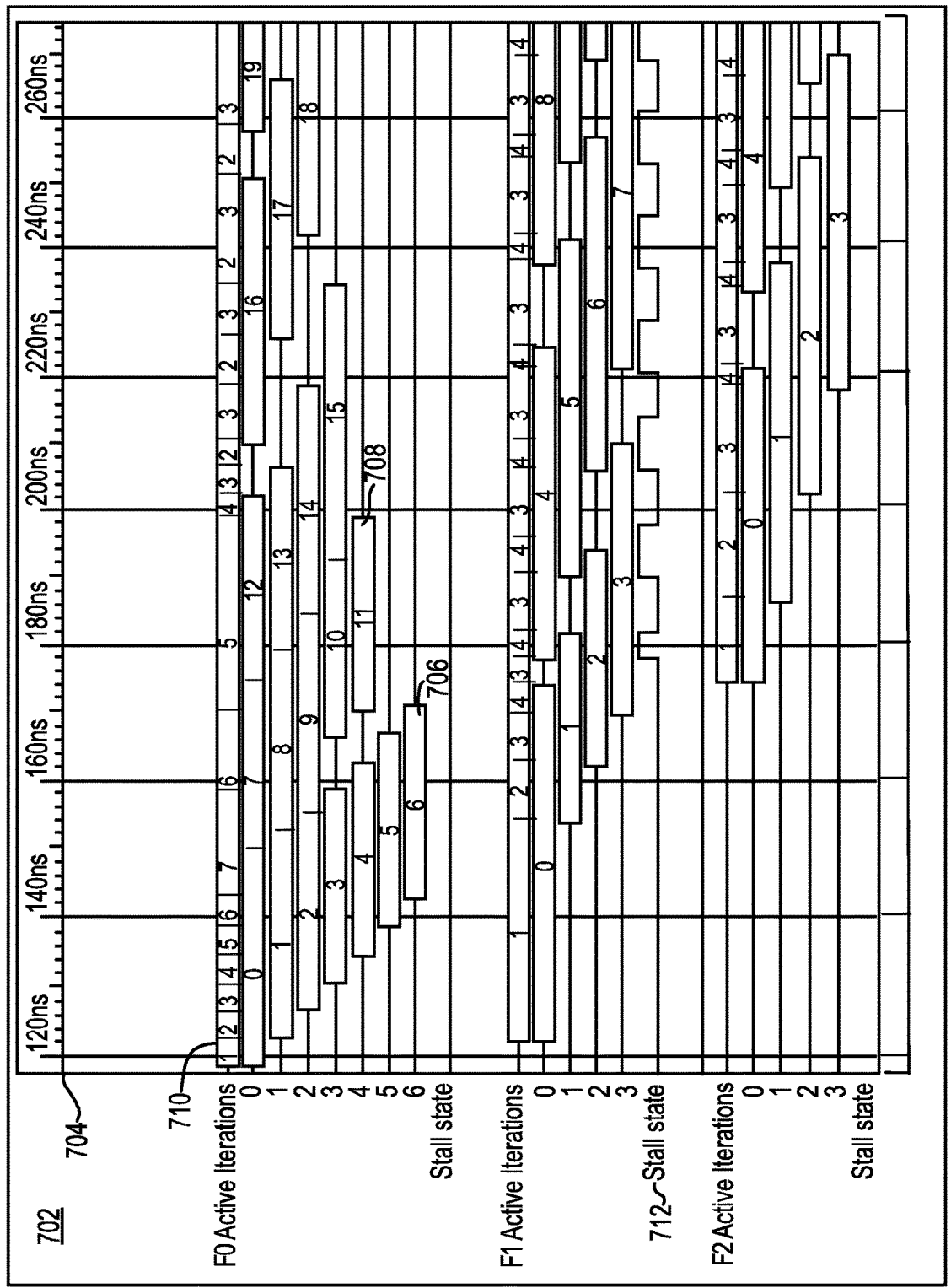
FIG. 7 shows an exemplary display of graphics objects that depict active iterations determined from the states of sets of handshake signals of multiple sub-circuits.
Figure 8:
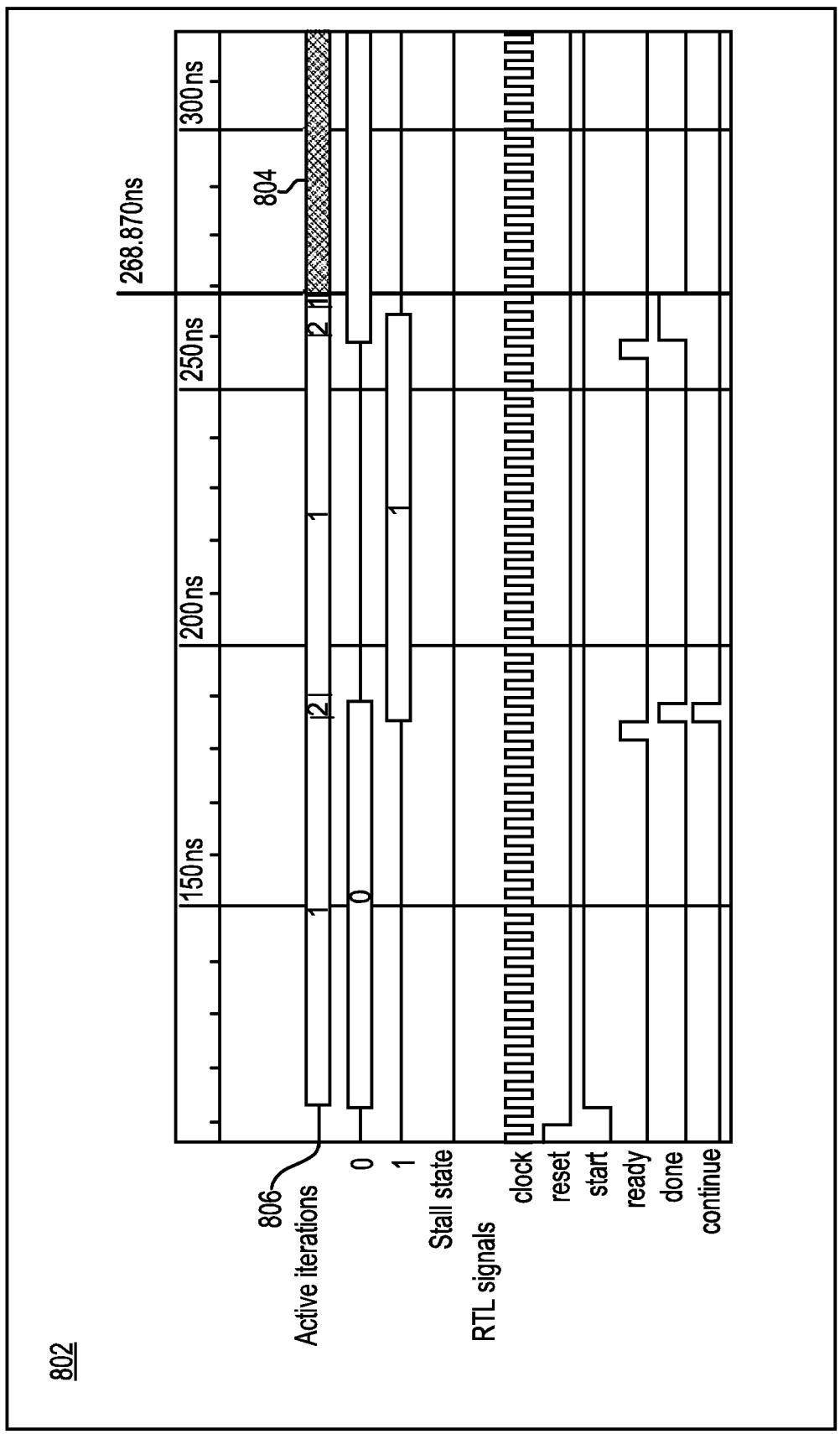
FIG. 8 shows an exemplary display of a graphics object that depicts a violation of a protocol of the handshake signals.

To illustrate operation of the analyzer tool in depicting the parallel iterations of sub-circuits in relation to the sets of handshake signals, the following description begins with a simple example of an HLL function and the resulting sub-circuits and handshake signals as shown in FIG. 1. The states of the handshake signals of the exemplary sub-circuits based on a simulation are illustrated in FIG. 2. FIG. 3 shows the handshake signals input to and the generated outputs from the analyzer tool. FIG. 4 shows a flowchart of a process implemented by the analyzer tool. FIG. 5 shows the state machine implemented by the analyzer tool for interpreting start and ready handshake signals of a sub-circuit, and FIG. 6 shows the state machine implemented by the analyzer tool for interpreting done and continue handshake signals of a sub-circuit. FIG. 7 shows a timing diagram showing the graphics objects that depict active iterations of the exemplary sub-circuits. FIG. 8 shows a timing diagram that illustrates the graphics object generated and displayed by the analyzer tool in response to detecting a violation of the handshake protocol.

FIG. 1 shows exemplary circuitry generated from a simple HLL function. The exemplary HLL function is shown in Example 1.

```
void kernel (int *a, int *b){
    Loop0:
        for (int i=0; i<N; i++){
            #pragma HLS DATAFLOW
            int t0[N];
            int t1[N];
            F0(a,t0);
            F1(t0,t1);
            F2(t1,b);
        }
}
```

Example 1

The HLL function, kernel, calls functions F0, F1, and F2. The calls to F0, F1, and F2 are sequential, with F0 and F1 operating on vector t0, and F1 and F2 operating on vector t1. The example assumes that while F0 is operating on a portion of t0, F1 can at the same time be operating on another portion of t0. Also, while F1 is operating on a portion of t1, F2 can at the same time be operating on another portion of t1. Thus, the circuit implementation of F0, F1, and F2 can be pipelined and supports parallel execution. In addition, the circuit implementations of each of F0, F1, and F2 can be pipelined. Though not shown, it will be recognized that the HLL code can further includes pragmas for establishing buffers between the pipelined circuitry.

FIG. 1 shows sub-circuits 102, 104, and 106 that implement the functions of F0, F1, and F2, respectively. Buffer circuit 108 is connected between F0 102 and F1 104, and buffer circuit 110 is connected between F1 104 and F2 106. In the sub-circuits F0, F1, and F2, the handshake signals are start, ready, done, and continue. In the buffers 108 and 110, the handshake signals are write, not full, not empty, and read. Though not shown, it will be appreciated that data signals output from F0 are input to buffer 108, data signals output from buffer 108 are input to F1, data signals output from F1 are input to buffer 110, and data signals output from buffer 110 are input to F2. The handshake signals on the data input side of F0, F1, and F2 are start and ready, and the handshake signals on the data output side of F0, F1, and F2 are done and continue.

The states of the set of handshake signals of each sub-circuit can be monitored by an analyzer tool to detect the beginnings and endings of iterations. That is, the states of the start, ready, done, and continue signals of F0 indicate when an iteration of F0 begins and ends. The states of the sets of handshake signals of F1 and F2 similarly indicate when respective iterations of F1 and F2 begin and end. The states of the handshake signals write, not full, not empty, and read of each buffer circuit similarly indicate active iterations of the buffer circuits 108 and 110. The following discussion describes operation of the analyzer tool on the states of the start, ready, done, and continue signals of the sub-circuits 102, 104, and 106. Though not discussed, it will be appreciated that the discussion below is equally applicable to the write, not full, not empty, and read handshake signals of the buffer circuits 108 and 110.

The exemplary HLL function, kernel, and the called functions F0, F1, and F2 may allow for multiple levels of parallelism. As indicated above, at one level, the F0, F1, and F2 sub-circuits 102, 104, and 106 may execute concurrently on different data sets. Another level of parallelism can be supported within the sub-circuits F0, F1, and F2. The exemplary HLL code shows calls to F0, F1, and F2 within a for loop, and each sub-circuit may execute concurrently on different iterations of the for loop. For example, F0 may concurrently operate on iteration i=0 and iteration i=1. Another level of parallelism is that the kernel function can be called multiple times, and the sub-circuits can support concurrent execution of the multiple calls to the kernel.

The beginnings and endings of the iterations of F0, F1, and F2 can be determined based on the states of the handshake signals start, ready, done, and continue. The start signal is input to a sub-circuit and indicates that input signals are ready to be read. The sub-circuit expects the start signal to be asserted until the sub-circuit asserts the output ready signal. The ready signal output by a sub-circuit indicates that the sub-circuit can begin another iteration. F0 and F1 operate in a producer-consumer relationship as do F1 and F2. F0 produces data that is consumed by F1, and F1 produces data that is consumed by F2. F0 signals to F1 when data is available to be consumed, and F1 signals to F0 when F1 is ready to consume more data. Similarly, F1 signals to F2 when data is available to be consumed, and F2 signals to F1 when F2 is ready to consume more data.

The done signal output by a sub-circuit indicates that output signals are ready to be captured. The sub-circuit asserts the done signal until the input continue signal is asserted. When the continue signal input to the sub-circuit is asserted, new data can be output from the sub-circuit on the next cycle. The state of the continue signal provides a backpressure control.

FIG. 2 shows an exemplary display of the handshake signals associated with the sub-circuits generated from the HLL program code of Example 1. The example illustrates the difficulty of manually correlating states of handshake signals with the beginnings and endings of iterations of the sub-circuits F0, F1, and F2. The display 202 shows separate groups of handshake signals of the F0, F1, and F2 sub-circuits, along with input clock and reset signals. The typical HDL waveform view is not sufficient to abstract and view the parallel states of the sub-circuits.

For the start and ready handshake signals, a handshake begins for a sub-circuit when either 1) start transitions from an unasserted state (e.g., 0) to an asserted state (e.g., 1) or 2) start is in an asserted state and ready was in an asserted state. A handshake ends when ready is in an asserted state and start is in an asserted state.

For the done and continue handshake signals, a handshake begins for a sub-circuit when either 1) done transitions from an unasserted state (e.g., 0) to an asserted state (e.g., 1) or 2) done is in an asserted state and continue was in an asserted state. A handshake ends when continue is in an asserted state and done is in an asserted state.

The start signal is not a pulse, but the ready signal can be a pulse. The done signal can also be a pulse. The ready signal can be asserted after the done signal is asserted.

The states of the start and ready signals indicate the beginning of an iteration (see also FIG. 5), and the states of the done and continue signals indicate the end of the iteration (see also FIG. 6). An iteration can begin in response to start and ready being unasserted and transitioning to start being asserted and ready being either unasserted or asserted. An iteration can also begin in response to start and ready being asserted and transitioning to start being asserted and ready being either unasserted or asserted.

The states of the done and continue signals indicate the end of an iteration. An iteration can end in response to the done and continue signals transitioning from any of done-unasserted/continue-unasserted, done-unasserted/continue-asserted, or done-asserted/continue-asserted to either done-asserted/continue-unasserted or done-asserted/continue-asserted.

As can be seen from FIG. 2, correlating states of multiple handshake signals with iterations of the sub-circuits can be exceedingly difficult.

FIG. 3 shows a handshake protocol analyzer tool 302 that translates handshake signal states into graphics objects that illustrate active iterations of sub-circuits of a circuit design. The analyzer inputs sets of handshake signals associated with the sub-circuits of interest. Each set of handshake signals includes a start signal, ready signal, done signal, and a continue signal. The example shows N sets of handshake signals. Clock and reset signals are also input to the analyzer tool. The clock signal triggers the analyzer to evaluate of the states of the handshake signals to detect beginnings and endings of iterations, stalls of sub-circuits, and errors in the handshake protocol.

The analyzer circuit generates and outputs a number of signals based on the states of the sets of handshake signals of the N sub-circuits. The output signals can be used to produce a timing diagram (e.g., FIG. 7) that illustrates active iterations of the sub-circuits along with iteration counts, stalled sub-circuits, and violations of the handshake protocol. The iteration state signals 304 can indicate for each of sets (1-N) of handshake signals whether the states of the set of handshake signals indicate the beginning or the end of an iteration of the associated sub-circuit.

Along with signaling the beginning and endings of iterations, the analyzer 302 counts active iterations and outputs relevant values. The outstanding active iteration count on signal line 306 indicates the total number of active iterations indicated by all the sets of handshake signals. An iteration is active commencing with detecting the beginning of a handshake and the iteration remains active until the states of the handshake signals indicate the end of the iteration. The analyzer also counts respective numbers of active iterations of the sub-circuits and outputs N active iteration counts on signal lines 308.

The analyzer 302 can also detect stalled states of the sub-circuits based on the states of the associated sets of handshake signals. A sub-circuit is determined to be in a stalled state in response to the associated done signal being asserted and the continue signal being unasserted. The analyzer outputs on signal lines 310 N stall signals corresponding to the N sets of handshake signals, respectively. The state of each stall signals indicates whether the states of the associated set of handshake signals indicate a stalled state.

N tool tip signals can be generated and output by the analyzer on signal lines 312. The tool tip signals can indicate the number of function calls and the latest iteration number, for example.

The analyzer can detect violations of the handshake protocol by the sub-circuits based on the states of the associated sets of handshake signals. Possible handshake protocol violations are described in conjunction with FIGS. 5 and 6. The analyzer outputs on signal lines 314 N protocol error signals corresponding to the N sets of handshake signals, respectively. The state of each protocol error signal indicates whether the states of the associated set of handshake signals indicate violation of the protocol.

FIG. 4 shows a flowchart of a process for detecting iteration states of pipelined sub-circuits and displaying useful information regarding the iteration states based on handshake signals between the sub-circuits. At block 402, an analyzer tool inputs sets of handshake signals associated with the sub-circuits. A block 404, the analyzer tool monitors states of the sets of handshake signals. The states of the handshake signals can be evaluated at each clock cycle. The process of FIG. 4 of analyzing the states of handshake signals protocol analysis can be performed as a circuit simulation is executing by reading and analyzing states of signals from a waveform database as signal states are stored in the database during the simulation. Alternatively, the process can be performed at a convenient time after a simulation is complete using the waveform data retentively stored in the database.

During simulation, the waveform database can be back-annotated and supplemented with data that describe the iteration states of the sub-circuits. The added back-annotation data allows presentation of a high-level view of the hand-shaking protocol in conjunction with the low level RTL signal waveforms. The combined view allows HDL/RTL engineers to study the high-level information and low-level waveforms in the same viewer.

The analyzer tool can perform the operations of block 406 for each set of handshake signals. At decision block 408, the analyzer tool tests the states of the set of handshake signals to determine if the handshake signals indicate the beginning of an iteration. In response to detecting the beginning of an iteration, the analyzer tool at block 410 generates and displays a graphics object to represent the active iteration. The graphics object can be a bar overlaid on a timeline, and the bar can have a bound on the timeline at the time at which the iteration began.

If the analyzer tool did not detect the beginning of an iteration at block 408, the analyzer tool continues at block 412 to test whether the states of the set of handshake signals indicate the end of an iteration. In response to detecting the end of an iteration, the analyzer tool at block 414 bounds the graphics object indicate that the active iteration is complete. The end bound of the graphics object is on the timeline at the time at which the iteration ended. If the analyzer tool did not detect the end of an iteration at block 412, the analyzer tool skips block 414 and continues at block 416.

At block 416, the analyzer tool adjusts the counted number of active iterations of the sub-circuit in response detecting the beginning or end of an iteration at blocks 408 and 412. The counted number of active iterations can be output and displayed on a timeline associated with the sub-circuit and at a position that corresponds to the time which the counted number of active iterations was tallied.

At block 418, the analyzer tool determines whether the associated sub-circuit is in a stalled state or an unstalled state based on the states of the associated set of handshake signals, and the state of a representative stall signal for the sub-circuit is updated accordingly and the output for display. As explained above, a sub-circuit is in a stalled state if the associated done signal is asserted and the associated continue signal is not asserted.

The analyzer tool at block 420 determines whether or not the states of the set of handshake signals indicate a violation of the handshake protocol and thereby indicate that the sub-circuit is in an error state. The possible violations are illustrated in states of the state machines of FIGS. 5 and 6. In response to detecting a violation, at block 422, the analyzer tool generates an error graphics object, such as a colored bar, and outputs the object for display on a timeline associated with the sub-circuit. The error graphics object has a starting bound that corresponds to a time at which the error state commenced. If a violation of the handshake protocol was not detected, the analyzer bypasses block 422 and continues at block 424, which repeats the processing of block 406 at the next clock cycle.

FIG. 5 shows a state diagram that can be used to identify the beginning of an iteration, and a violation of a handshake protocol based on signal states of the start and ready handshake signals of a sub-circuit. The start and ready signals are the handshake signals on the data input side of a sub-circuit. The states of the start and ready signals from which the sub-circuit can transition are shown in the column labeled with states 0/0, 0/1, 1/0, and 1/1, and the states of the start and ready signals to which the sub-circuit can transition are shown in the row labeled with states 0/0, 0/1, 1/0, and 1/1. Each state in which the beginning of an iteration is indicated is denoted by the "+" notation.

The beginning of an iteration is detected in response to the start signal transitioning from unasserted to asserted (0/0 to 1/0 or 0/0 to 1/1), as long as ready remains unasserted or transitions from unasserted to asserted. The beginning of an iteration is also detected in response to the start signal being asserted and the ready signal transitioning from asserted to unasserted (1/1 to 1/0) or the start signal being asserted and the ready signal remaining asserted (1/1 to 1/1). Each state in which the beginning of an iteration is detected, the active iteration count is incremented, as indicated by the "+" notation.

A handshake ends in response to the ready signal being asserted and the start signal being asserted (0/0 to 1/1, 1/0 to 1/1, or 1/1 to 1/1).

Error states are shown by the cross-hatched blocks in the state diagram. Two examples of error states are indicated by the start signal transitioning from an asserted state to an unasserted state and a ready signal being in an unasserted state (1/0 to 0/0), or the start signal transitioning from an asserted state to an unasserted state and the ready signal transitioning from an unasserted state to an asserted state (1/0 to 0/1).

FIG. 6 shows a state diagram that can be used to identify the end of an iteration, a stalled state of a sub-circuit, and a violation of a handshake protocol based on signal states of the done and continue handshake signals of a sub-circuit. The done and continue signals are the handshake signals on the data output side of a sub-circuit. Each state in which the end of an iteration is indicated is denoted by the "-" notation.

A handshake begins and an iteration ends in response to the done signal transitioning from unasserted to asserted (0/0 to 1/0 or 0/0 to 1/1), as long as continue remains unasserted or transitions from unasserted to asserted. Also, a handshake begins and an iteration ends in response to the done signal being asserted and the continue signal transitioning from asserted to unasserted (1/1 to 1/0) or the done signal being asserted and the continue signal remaining asserted (1/1 to 1/1). Each state in which the end of an iteration is detected, the active iteration count is decremented, as indicated by the "-" notation.

A handshake and iteration end in response to the continue signal being asserted and the done signal being asserted (0/0 to 1/1, 1/0 to 1/1, or 1/1 to 1/1).

Two error states are indicated by the done signal transitioning from an asserted state to an unasserted state and the continue signal being in an unasserted state (1/0 to 0/0), or the done signal transitioning from an asserted state to an unasserted state and the continue signal transitioning from an unasserted state to an asserted state (1/0 to 0/1).

FIG. 7 shows an exemplary display 702 of graphics objects that depict active iterations determined from the states of sets of handshake signals of multiple sub-circuits. The display can be a monitor of a computer system on which the illustrated information is presented.

The data is presented as a timing diagram having timelines associated with each of the exemplary sub-circuits F0, F1 and F2. The scale 704 of the timelines is ranges from approximately 120 ns to 260 ns. Each of sub-circuits F0, F1, and F2 has an associated set of timelines numbered 0-M. F0 has 7 timelines numbered 0-6, F1 has 4 timelines numbered 0-3, and F2 has 4 timelines numbered 0-3. The different numbers of timelines represent the different maximum numbers of active iterations detected by the analyzer tool for the sub-circuits.

Examples of the graphics objects that depict active iterations include bars 706 and 708. Each bar (or "active iteration bar") corresponds to one active iteration of one of the sub-circuits. Each active iteration bar is overlaid on a timeline, and the bounds of the bar correspond to the times at which the iteration began and ended. For example, iteration 0 of F0 began slightly before 120 ns and ended at approximately 146 ns. When an iteration ends, the same timeline can be reused when another iteration begins. For example, F0 timeline numbered 0 shows that when the active iteration bar numbered 0 ends, the active iteration bar numbered 7 can be displayed on the same timeline.

The multiple timelines associated with each sub-circuit show that each sub-circuit can have multiple concurrently active iterations. If an iteration has not ended before another iteration begins, the active iteration bar for the newly beginning iteration is displayed on a different timeline. For example, F0 has timelines 0-6, and at time 144 ns, iterations 0-6 are active. The numbers on the active iteration bars identify the iteration number, which is cumulative. For example, the durations of iterations numbered 0-19 of F1 are shown by the active iteration bars numbered 0-19. The timelines further illustrate when the sub-circuits have concurrent active iterations. For example, at time 178 ns, F0 has active iterations numbered 8, 9, 10, 11, and 12; F1 has active iterations numbered 1, 2, 3, and 4; and F2 has the active iteration numbered 0.

The timing diagram further shows the number of active iterations at different times on timelines associated with the sub-circuits F0, F1, and F2. For example timeline 710 is associated with F0 and shows the numbers of active iterations. At time 120 ns, F0 has one active iteration, which is iteration 0. As the number of active iterations changes, new values are displayed on the timeline. For example, at time 140 ns, F0 has 6 active iterations including iterations numbered 0, 1, 2, 3, 4, and 5; and at time 148 ns, F0 has 7 active iterations including iterations numbered 0, 1, 2, 3, 4, 5, and 6.

Each sub-circuit has an additional associated timeline to show the state of a representative stall signal over time. The state of the representative stall signal indicates whether the associated sub-circuit is in a stalled state or an unstalled state. For example, a stall state timeline 712 is associated with sub-circuit F1. F1 is in an unstalled state until time 178 ns, in a stalled state between 178 ns and 182 ns, and varies between an unstalled state and a stalled state at times thereafter.

FIG. 8 shows an exemplary display 802 of a graphics object that depicts a violation of a protocol of the handshake signals. The graphic object that indicates the protocol error is bar 804. The bar is overlaid on the timeline 806 that shows the numbers of active iterations interrupts of a sub-circuit, which is unnamed in the exemplary timing diagram. The protocol error bar begins at time 268.870 ns.

The exemplary protocol error bar 804 can result from detection of the done signal going unasserted while the continue signal remains unasserted. The error states shown in FIGS. 5 and 6 and described above in relation to the start, ready, done, and continue signals would similarly result in display of a protocol error bar.

Figure 9:
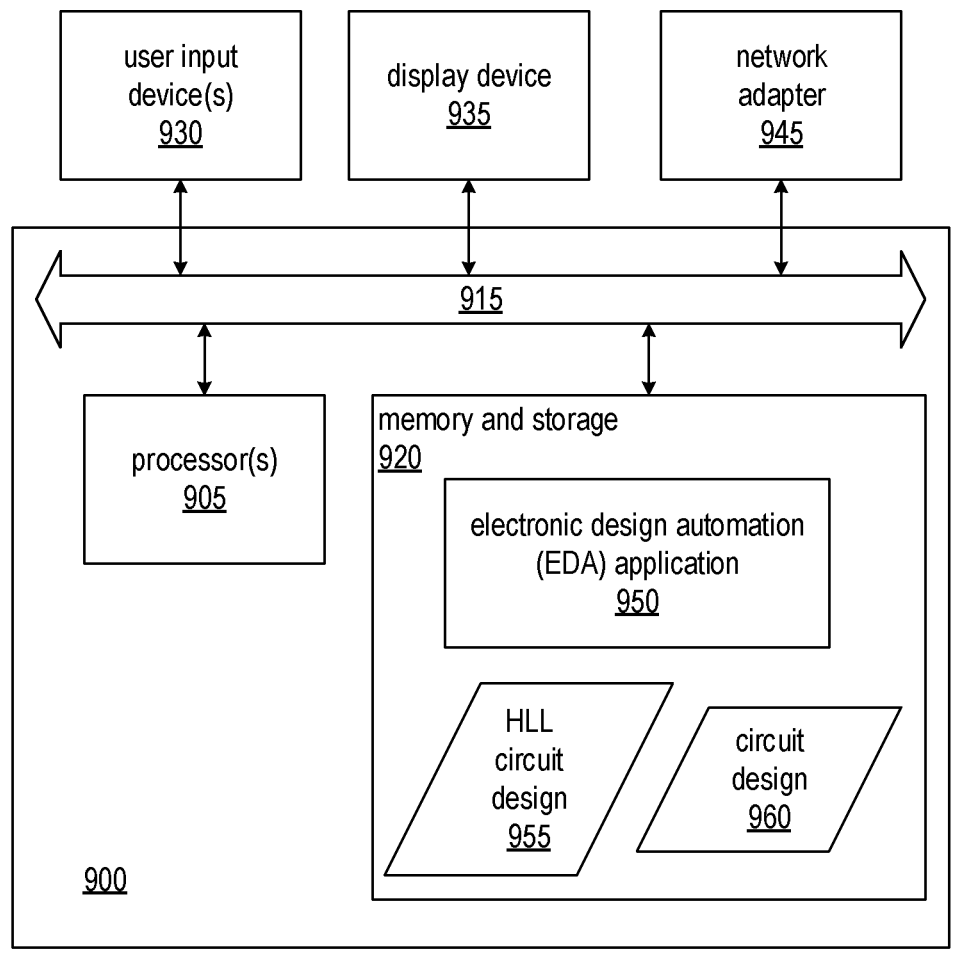
FIG. 9 is a block diagram illustrating an exemplary data processing system.

FIG. 9 is a block diagram illustrating an exemplary data processing system (system) 900. System 900 is an example of an EDA system. As pictured, system 900 includes at least one processor circuit (or "processor"), e.g., a central processing unit (CPU) 905 coupled to memory and storage arrangement 920 through a system bus 915 or other suitable circuitry. System 900 stores program code and circuit design 100 within memory and storage arrangement 920. Processor 905 executes the program code accessed from the memory and storage arrangement 920 via system bus 915. In one aspect, system 900 is implemented as a computer or other data processing system that is suitable for storing and/or executing program code. It should be appreciated, however, that system 900 can be implemented in the form of any system including a processor and memory that is capable of performing the functions described within this disclosure.

Memory and storage arrangement 920 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 900 may also include one or more cache memories (not shown) that provide temporary storage of at least some program code and data in order to reduce the number of times program code and data must be retrieved from local memory and persistent storage during execution.

Input/output (I/O) devices such as user input device(s) 930 and a display device 935 may be optionally coupled to system 900. The I/O devices may be coupled to system 900 either directly or through intervening I/O controllers. A network adapter 945 also can be coupled to system 900 in order to couple system 900 to other systems, computer systems, remote printers, and/or remote storage devices through intervening private or public networks. Modems, cable modems, Ethernet cards, and wireless transceivers are examples of different types of network adapter 945 that can be used with system 900.

Memory and storage arrangement 920 may store an EDA application 950. EDA application 950, being implemented in the form of executable program code, is executed by processor(s) 905. As such, EDA application 950 is considered part of system 900. System 900, while executing EDA application 950, receives and operates on circuit design 100. In one aspect, system 900 performs a design flow on HLL circuit design 955, and the design flow may include high-level synthesis, simulation, analysis and debugging consistent with the analyzer tool described herein, register-transfer-level synthesis, mapping, placement, routing, and generation of implementation data 960 that can be used to implement a functional circuit in programmable logic or as an application specific integrated circuit (ASIC).

EDA application 950, circuit design 100, circuit design 960, and any data items used, generated, and/or operated upon by EDA application 950 are functional data structures that impart functionality when employed as part of system 900 or when such elements, including derivations and/or modifications thereof, are loaded into an IC such as a programmable IC causing implementation and/or configuration of a circuit design within the programmable IC.

Some implementations are directed to a computer program product (e.g., nonvolatile memory device), which includes a machine or computer-readable medium having stored thereon instructions which may be executed by a computer (or other electronic device) to perform these operations/activities. The disclosed approaches can alternatively be implemented as a hardware circuit initially specified in a hardware description language (HDL) such as Verilog and processed using an EDA application.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for analyzing and debugging circuit designs. Other aspects and features will be apparent to those skilled in the art from consideration of the specification. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method comprising:
monitoring states of a plurality of sets of a plurality of handshake signals by an analyzer tool executing on a computer system, each set of handshake signals associated with a respective one sub-circuit of a plurality of sub-circuits;
performing by the analyzer tool for each sub-circuit of the plurality of sub-circuits, operations including:
detecting a beginning of an iteration by the sub-circuit based on states of the plurality of handshake signals of the set associated with the sub-circuit;
generating, in response to detecting the states of the set of handshake signals associated with the sub-circuit indicating the beginning of the iteration, a respective graphics object representative of the iteration;
displaying on a display device, the respective graphics object overlaid on a timeline associated with the sub-circuit and having a first bound on the timeline corresponding to the beginning of the iteration;
detecting an end of the iteration based on the states of the plurality of handshake signals of the set associated with the sub-circuit; and
bounding the graphics object with a second bound on the timeline in response to detecting the states of the set of handshake signals associated with the sub-circuit indicating the end of the iteration.

2. The method of claim 1, wherein:
the generating includes generating, in response to detecting at different times the states of the set of handshake signals associated with the sub-circuit indicating beginnings of a plurality of iterations, a plurality of graphics objects representative of the iterations;
the displaying includes displaying the plurality of graphic objects overlaid on two or more timelines and having respective first bounds corresponding to the beginnings of the iterations;
the detecting includes detecting ends of the plurality of iterations based on the states of the plurality of handshake signals of the set associated with the sub-circuit; and
the bounding includes bounding the plurality of graphics objects with respective second bounds in response to detecting the states of the set of handshake signals associated with the sub-circuit indicating the ends the iterations.

3. The method of claim 1, further comprising:
performing by the analyzer tool for each sub-circuit of the plurality of sub-circuits, operations including:
determining whether the sub-circuit is in a stalled state or an unstalled state based on the states of the associated set of handshake signals; and
displaying on the display device on a timeline associated with the sub-circuit, states of a representative signal and the states corresponding to the stalled state and unstalled state.

4. The method of claim 1, further comprising:
performing by the analyzer tool for each sub-circuit of the plurality of sub-circuits, operations including:
determining whether or not states of the set of handshake signals associated with the sub-circuit indicate a violation of a handshake protocol; and
displaying on the display device in response to determining the violation of the handshake protocol, a graphics object overlaid on a timeline associated with the sub-circuit and having a starting bound that corresponds to a time at which the violation of the handshake protocol occurred.

5. The method of claim 1, further comprising:
performing by the analyzer tool for each sub-circuit of the plurality of sub-circuits, operations including:
counting a respective number of active iterations of the sub-circuit as an active iteration count; and
displaying on the display device on a timeline associated with the sub-circuit, the active iteration count at different times on the timeline.

6. The method of claim 1, further comprising:
performing by the analyzer tool for each sub-circuit of the plurality of sub-circuits, operations including:
counting a respective cumulative number of active iterations of the sub-circuit as a cumulative active iteration count; and
displaying on the display device on the graphics object, the cumulative active iteration count.

7. The method of claim 1, wherein:
the detecting the beginning of the iteration includes detecting the beginning of the iteration in response to the associated set of handshake signals indicating a start signal transitioning from an unasserted state to an asserted state, or the start signal being in the asserted state and a ready signal previously being in an asserted state; and
the detecting the end of the iteration includes detecting the end of the iteration in response to the associated set of handshake signals indicating the start signal is an asserted state and the ready signal is in an asserted state.

8. The method of claim 7, wherein:
the detecting the beginning of the iteration includes detecting the beginning of the iteration in response to the associated set of handshake signals indicating a done signal transitioning from an unasserted state to an asserted state, or the done signal being in the asserted state and a continue signal previously being in an asserted state; and the detecting the end of the iteration includes detecting the end of the iteration in response to the associated set of handshake signals indicating the done signal is the asserted state and the continue signal is in the asserted state.

9. The method of claim 1, further comprising:
performing by the analyzer tool for each sub-circuit of the plurality of sub-circuits, operations including:
determining that the sub-circuit is in an error state in response to the associated set of handshake signals indicating a start signal transitioning from an asserted state to an unasserted state and a ready signal being in an unasserted state, or the start signal transitioning from the asserted state to the unasserted state and the ready signal transitioning from the unasserted state to an asserted state; and
displaying on the display device a graphics object representative of the error state, overlaid on a timeline associated with the sub-circuit, and having a starting bound that corresponds to a time at which the error state commenced.

10. The method of claim 1, further comprising:
performing by the analyzer tool for each sub-circuit of the plurality of sub-circuits, operations including:
determining that the sub-circuit is in an error state in response to the associated set of handshake signals indicating a done signal transitioning from an asserted state to an unasserted state and a continue signal being in an unasserted state, or the done signal transitioning from the asserted state to the unasserted state and the continue signal transitioning from the unasserted state to an asserted state; and
displaying on the display device a graphics object representative of the error state, overlaid on a timeline associated with the sub-circuit, and having a starting bound that corresponds to a time at which the error state commenced.

11. A system comprising:
one or more computer processors configured to execute program code; and
a memory arrangement coupled to the one or more computer processors, wherein the memory arrangement is configured with instructions that when executed by the one or more computer processors cause the one or more computer processors to perform operations including:
monitoring states of a plurality of sets of a plurality of handshake signals, each set of handshake signals associated with a respective one sub-circuit of a plurality of sub-circuits; and
for each sub-circuit of the plurality of sub-circuits, operations including:
detecting a beginning of an iteration by the sub-circuit based on states of the plurality of handshake signals of the set associated with the sub-circuit;
generating, in response to detecting the states of the set of handshake signals associated with the sub-circuit indicating the beginning of the iteration, a respective graphics object representative of the iteration;
displaying on a display device, the respective graphics object overlaid on a timeline associated with the sub-circuit and having a first bound on the timeline corresponding to the beginning of the iteration;
detecting an end of the iteration based on the states of the plurality of handshake signals of the set associated with the sub-circuit; and
bounding the graphics object with a second bound on the timeline in response to detecting the states of the set of handshake signals associated with the sub-circuit indicating the end of the iteration.

12. The system of claim 11, wherein:
the instructions for generating include instructions for generating, in response to detecting at different times the states of the set of handshake signals associated with the sub-circuit indicating beginnings of a plurality of iterations, a plurality of graphics objects representative of the iterations;
the instructions for displaying include instructions for displaying the plurality of graphic objects overlaid on two or more timelines and having respective first bounds corresponding to the beginnings of the iterations;
the instructions for detecting include instructions for detecting ends of the plurality of iterations based on the states of the plurality of handshake signals of the set associated with the sub-circuit; and
the instructions for bounding include instructions for bounding the plurality of graphics objects with respective second bounds in response to detecting the states of the set of handshake signals associated with the sub-circuit indicating the ends the iterations.

13. The system of claim 11, wherein the memory arrangement is further configured with instructions that when executed by the one or more computer processors cause the one or more computer processors to perform operations including:
for each sub-circuit of the plurality of sub-circuits:
determining whether the sub-circuit is in a stalled state or an unstalled state based on the states of the associated set of handshake signals; and
displaying on the display device on a timeline associated with the sub-circuit, states of a representative signal and the states corresponding to the stalled state and unstalled state.

14. The system of claim 11, wherein the memory arrangement is further configured with instructions that when executed by the one or more computer processors cause the one or more computer processors to perform operations including:
for each sub-circuit of the plurality of sub-circuits:
determining whether or not states of the set of handshake signals associated with the sub-circuit indicate a violation of a handshake protocol; and
displaying on the display device in response to determining the violation of the handshake protocol, a graphics object overlaid on a timeline associated with the sub-circuit and having a starting bound that corresponds to a time at which the violation of the handshake protocol occurred.

15. The system of claim 11, wherein the memory arrangement is further configured with instructions that when executed by the one or more computer processors cause the one or more computer processors to perform operations including:
for each sub-circuit of the plurality of sub-circuits:
counting a respective number of active iterations of the sub-circuit as an active iteration count; and displaying on the display device on a timeline associated with the sub-circuit, the active iteration count at different times on the timeline.

16. The system of claim 11, wherein the memory arrangement is further configured with instructions that when executed by the one or more computer processors cause the one or more computer processors to perform operations including:
for each sub-circuit of the plurality of sub-circuits:
counting a respective cumulative number of active iterations of the sub-circuit as a cumulative active iteration count; and
displaying on the display device on the graphics object, the cumulative active iteration count.

17. The system of claim 11, wherein:
the instructions for detecting the beginning of the iteration include instructions for detecting the beginning of the iteration in response to the associated set of handshake signals indicating a start signal transitioning from an unasserted state to an asserted state, or the start signal being in the asserted state and a ready signal previously being in an asserted state; and
the instructions for detecting the end of the iteration include instructions for detecting the end of the iteration in response to the associated set of handshake signals indicating the start signal is an asserted state and the ready signal is in an asserted state.

18. The system of claim 17, wherein:
the instructions for detecting the beginning of the iteration include instructions for detecting the beginning of the iteration in response to the associated set of handshake signals indicating a done signal transitioning from an unasserted state to an asserted state, or the done signal being in the asserted state and a continue signal previously being in an asserted state; and
the instructions for detecting the end of the iteration include instructions for detecting the end of the iteration in response to the associated set of handshake signals indicating the done signal is the asserted state and the continue signal is in the asserted state.

19. The system of claim 11, wherein the memory arrangement is further configured with instructions that when executed by the one or more computer processors cause the one or more computer processors to perform operations including:
for each sub-circuit of the plurality of sub-circuits:
determining that the sub-circuit is in an error state in response to the associated set of handshake signals indicating a start signal transitioning from an asserted state to an unasserted state and a ready signal being in an unasserted state, or the start signal transitioning from the asserted state to the unasserted state and the ready signal transitioning from the unasserted state to an asserted state; and
displaying on the display device a graphics object representative of the error state, overlaid on a timeline associated with the sub-circuit, and having a starting bound that corresponds to a time at which the error state commenced.

20. The system of claim 11, wherein the memory arrangement is further configured with instructions that when executed by the one or more computer processors cause the one or more computer processors to perform operations including:
for each sub-circuit of the plurality of sub-circuits:
determining that the sub-circuit is in an error state in response to the associated set of handshake signals indicating a done signal transitioning from an asserted state to an unasserted state and a continue signal being in an unasserted state, or the done signal transitioning from the asserted state to the unasserted state and the continue signal transitioning from the unasserted state to an asserted state; and
displaying on the display device a graphics object representative of the error state, overlaid on a timeline associated with the sub-circuit, and having a starting bound that corresponds to a time at which the error state commenced.

\* \* \* \* \*